(12) United States Patent
Qian et al.

(10) Patent No.: US 11,480,627 B2
(45) Date of Patent: Oct. 25, 2022

(54) METHOD FOR DETERMINING MICRO SHORT CIRCUIT OF LITHIUM ION SECONDARY BATTERY

(71) Applicant: HONDA MOTOR CO., LTD., Tokyo (JP)

(72) Inventors: Pu Qian, Saitama (JP); Hiroshi Sakai, Saitama (JP)

(73) Assignee: HONDA MOTOR CO., LTD., Tokyo (JP)

( * ) Notice: Subject to any disclaimer, the term of this patent is extended or adjusted under 35 U.S.C. 154(b) by 259 days.

(21) Appl. No.: 16/889,822

(22) Filed: Jun. 2, 2020

(65) Prior Publication Data

US 2020/0386828 A1 Dec. 10, 2020

(30) Foreign Application Priority Data

Jun. 7, 2019 (JP) .............................. JP2019-107093

(51) Int. Cl.
| | |
|---|---|
| *G01R 31/00* | (2006.01) |
| *G01R 31/52* | (2020.01) |
| *H01M 10/0525* | (2010.01) |
| *G01R 31/385* | (2019.01) |
| *G01R 31/378* | (2019.01) |
| *H01M 10/44* | (2006.01) |

(52) U.S. Cl.
CPC ............ *G01R 31/52* (2020.01); *G01R 31/378* (2019.01); *G01R 31/3865* (2019.01); *H01M 10/0525* (2013.01); *H01M 10/44* (2013.01)

(58) Field of Classification Search
USPC ........................ 429/231; 324/426, 430–435
See application file for complete search history.

(56) References Cited

U.S. PATENT DOCUMENTS

2015/0214532 A1* 7/2015 Nakayama .......... H01M 50/528
429/50

FOREIGN PATENT DOCUMENTS

JP 2019075302 A 5/2019

* cited by examiner

*Primary Examiner* — Vincent Q Nguyen
(74) *Attorney, Agent, or Firm* — CKC & Partners Co., LLC

(57) ABSTRACT

Provided is a method for determining a micro short circuit of a lithium ion secondary battery which is capable of determining the presence or absence of a micro short circuit of the lithium ion secondary battery in a short time.
A relaxation process after the interruption of a discharging current or a charging current is analyzed and a voltage fluctuation component due to micro short circuit is separated and used in the determination.
Specifically, a method for determining a micro short circuit that determines presence or absence of the micro short circuit in a lithium ion secondary battery is provided which includes: a relaxation decomposition step of decomposing a change of a cell voltage in a relaxation process after interrupting charging current during charging or discharging current during discharging into a plurality of decomposition relaxation components; and a micro short circuit determination step of determining presence or absence of micro short circuit by determining presence or absence of a component in which a voltage drop has occurred due to the micro short circuit, among the plurality of decomposition relaxation components.

2 Claims, 2 Drawing Sheets

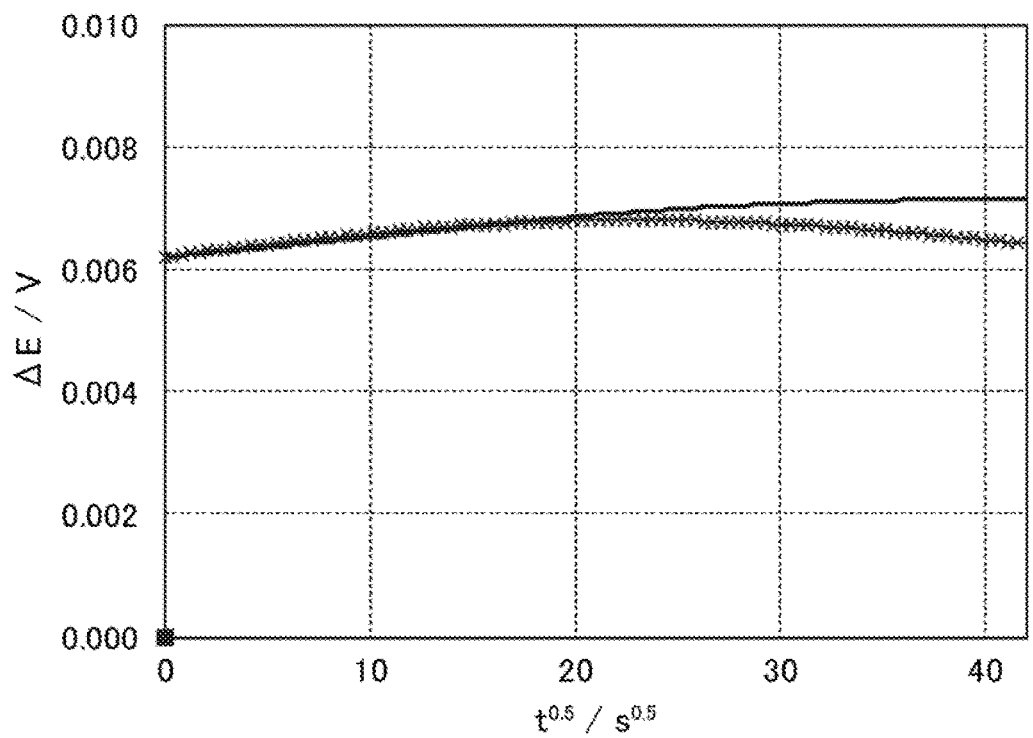
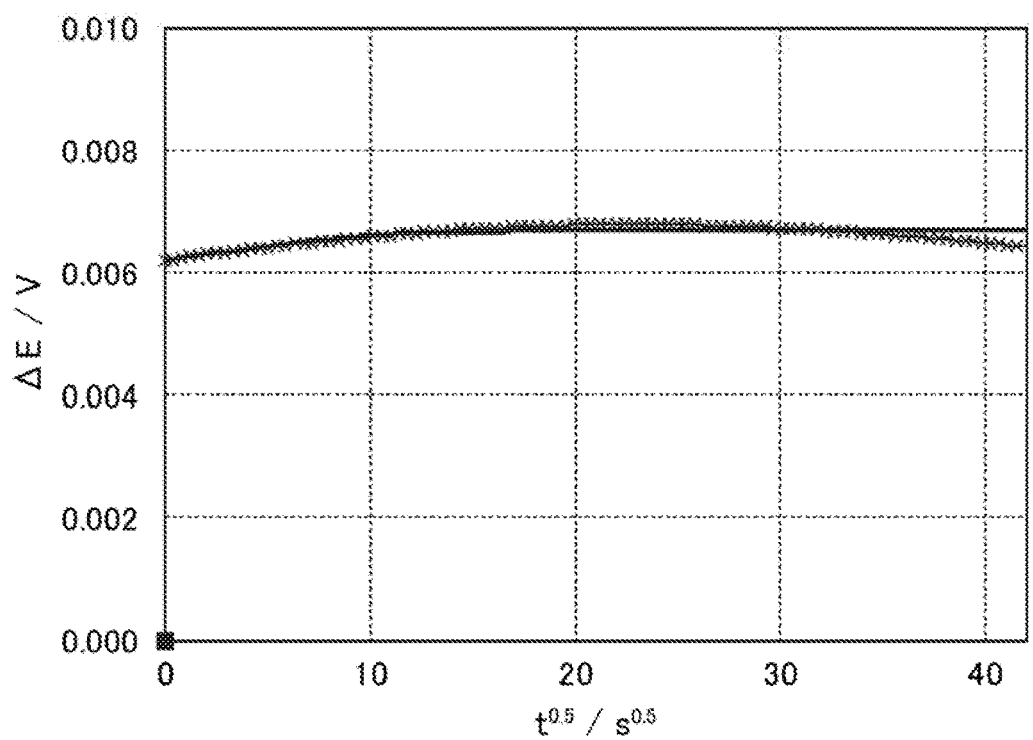

METHOD FOR DETERMINING MICRO SHORT CIRCUIT OF LITHIUM ION SECONDARY BATTERY

This application is based on and claims the benefit of priority from Japanese Patent Application No. 2019-107093, filed on 7 Jun. 2019, the content of which is incorporated herein by reference.

BACKGROUND OF THE INVENTION

Field of the Invention

The present invention relates to a method for determining a micro short circuit of a lithium ion secondary battery.

More specifically, the present invention relates to a method for determining a micro short circuit of a lithium ion secondary battery which is capable of determining the presence or absence of a micro short circuit of the lithium ion secondary battery in a short time.

Related Art

Conventionally, lithium ion secondary batteries are widely used as secondary batteries with high energy density. In this regard, the lithium ion secondary batteries are inspected before shipment, and the batteries having micro short circuits which become defective products are not shipped as manufactured goods.

However, the micro short circuit inspection before shipment is performed by observing the voltage drop of the cell over a long period of time.

The observation time takes, for example, one week to one month.

Therefore, a short-circuit inspection method has been proposed in which short circuit inspection is performed in a short time and the reliability of the inspection is improved (refer to Japanese Unexamined Patent Application, Publication No. 2019-075302).

Patent Document 1: Japanese Unexamined Patent Application, Publication No. 2019-075302

SUMMARY OF THE INVENTION

However, in the inspection method disclosed in Japanese Unexamined Patent Application, Publication No. 2019-075302, the determination is made on the basis of the comparison of the drop amount of the cell voltage in the non-charged secondary battery after the elapse of 24 hours or more since the completion of the injection of the electrolyte solution. In order to perform a determination with higher accuracy, it is necessary to perform observation for a longer period of time.

The present invention has been made in view of the above-mentioned background art, and an object thereof is to provide a method for determining a micro short circuit of a lithium ion secondary battery which is capable of determining the presence or absence of a micro short circuit of the lithium ion secondary battery in a short time.

The inventors have analyzed the relaxation process after interrupting a discharging current or a charging current, and have found that separating the voltage fluctuation component caused by the micro short circuit for use in the determination enables the determination of the presence or absence of a micro short circuit in a short time, thereby arriving at completion of the present invention.

According to an aspect of the present invention, a method for determining a micro short circuit that determines presence or absence of the micro short circuit in a lithium ion secondary battery is provided which includes: a relaxation decomposition step of decomposing a change of a cell voltage in a relaxation process after interrupting charging current during charging or discharging current during discharging into a plurality of decomposition relaxation components; and a micro short circuit determination step of determining presence or absence of micro short circuit by determining presence or absence of a component in which a voltage drop has occurred due to the micro short circuit, among the plurality of decomposition relaxation components.

The plurality of decomposition relaxation components may include a first decomposition relaxation component, a second decomposition relaxation component, and a third decomposition relaxation component, the first decomposition relaxation component may be a component in which a voltage drop occurs due to the micro short circuit, and the second decomposition relaxation component and the third decomposition relaxation component may be components of normal voltage drop.

According to the method for determining a micro short circuit of a lithium ion secondary battery of the present invention, it is possible to determine the presence or absence of the short circuit in a short time without requiring to observe the presence or absence of a short circuit for a long time.

BRIEF DESCRIPTION OF THE DRAWINGS

FIG. 2B is a graph showing behavior of the second decomposition relaxation component in the relaxation behavior of FIG. 1; and FIG. 2C is a graph showing behavior of the third decomposition relaxation component in the relaxation behavior of FIG. 1.

DETAILED DESCRIPTION OF THE INVENTION

Hereinafter, embodiments of the present invention will be described.

<Method for Determining Micro Short Circuit of Lithium Ion Secondary Battery>

The method for determining a micro short circuit of a lithium ion secondary battery of the present invention includes a relaxation decomposition step and a micro short circuit determination step.

It suffices if the method for determining the micro short circuit of the lithium ion secondary battery of the present invention includes these steps as essential steps, and may optionally include other steps.

(Relaxation Decomposition Step)

In the relaxation decomposition step, the change of the cell voltage in the relaxation process after interrupting the charging current during charging or the discharging current during discharging is decomposed into a plurality of decomposition relaxation components.

Examples of the method for decomposing the change of the cell voltage in the relaxation process after interrupting the charging current during charging or the discharging current during discharging into the plurality of decomposition relaxation components include a method for analyzing the relaxation process after interrupting the current.

Examples of the method for analyzing include a method using a time constant, and include, for example, a method using a diffusion equation.

In a case of a normal lithium-ion secondary battery, interrupting the charging current during charging causes the cell voltage to drop instantaneously, followed by a gradual relaxation.

On the other hand, interrupting the discharging current during discharge causes the cell voltage to rise instantaneously, followed by a gradual relaxation.

The method for determining a micro short circuit of a lithium ion secondary battery of the present invention determines the presence or absence of a micro short circuit by decomposing the change of the cell voltage into the plurality of decomposition relaxation components, and determining the presence or absence of a decomposition relaxation component in which a voltage drop has occurred due to the micro short circuit, thereby determining the presence or absence of the micro short circuit.

Hereinafter, embodiments of the present invention will be described with reference to the drawings.

Figure 1:
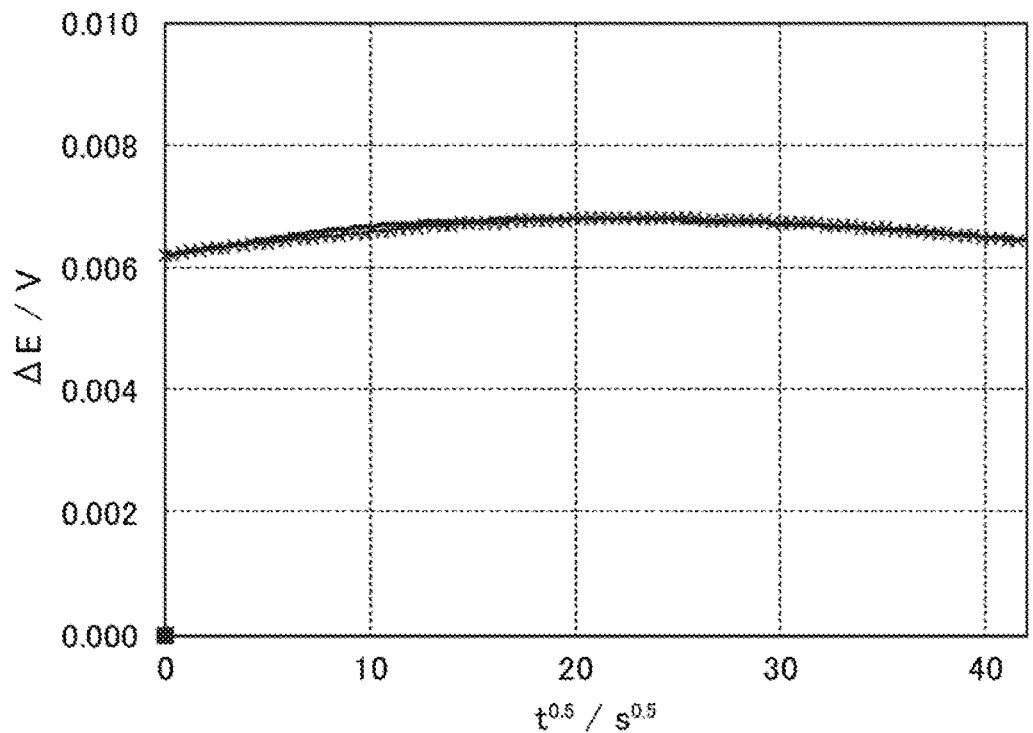
FIG. 1 is a graph showing relaxation behavior after interrupting the discharging current.

FIG. 1 is a graph showing the relaxation behavior of the cell voltage after interrupting the discharging current during discharge.

The vertical axis ΔE/V shows the change in voltage, and the horizontal axis t0.5/s0.5 shows the square root of the elapsed time.

In the graph shown in FIG. 1, when the discharging current is interrupted, the cell voltage of the battery instantaneously increases by approximately 0.006 V.

Thereafter, it is shown that a gradual relaxation has occurred.

In the relaxation decomposition step according to one embodiment of the present invention, the relaxation behavior shown in FIG. 1 is decomposed into relaxation components with three time constants.

Figure 2A:
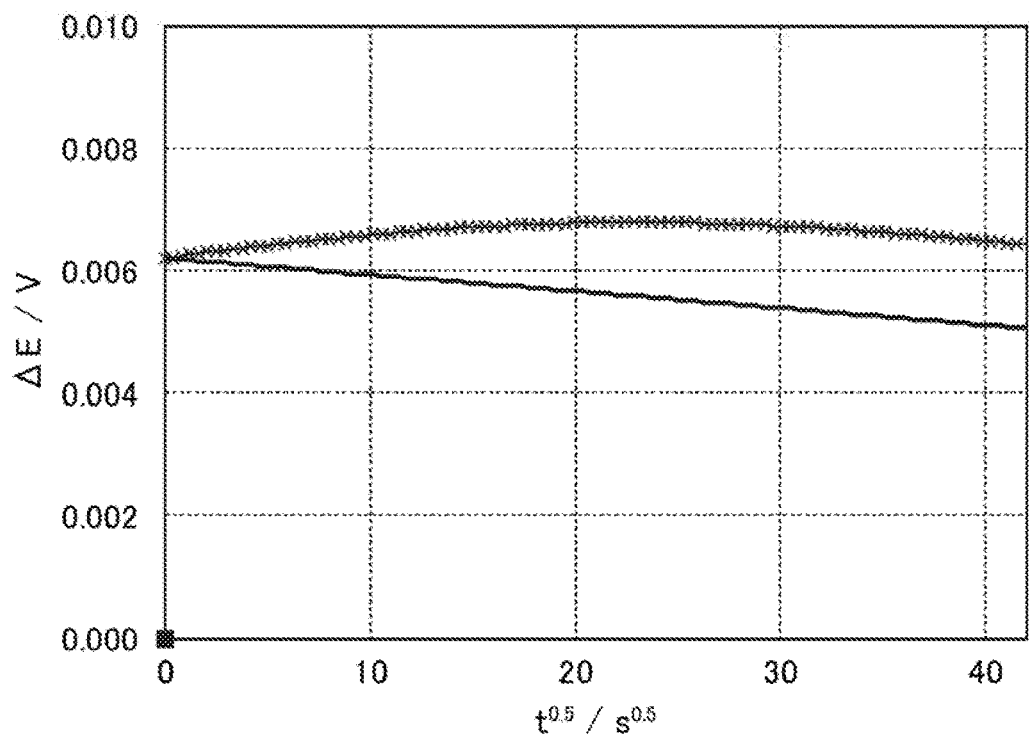
FIG. 2A is a graph showing behavior of the first decompose relaxation component in the relaxation behavior of FIG. 1.

FIG. 2A is a graph showing the behavior of the first decomposition relaxation component acquired by decomposing the relaxation behavior of FIG. 1 by the first time constant.

FIG. 2B is a graph showing the behavior of the second decomposition relaxation component decomposed by the second time constant, and FIG. 2C is a graph showing the behavior of the third decomposition relaxation component decomposed by the third time constant.

In FIGS. 2A to 2C, the curves marked with crosses are the same as the curve shown in FIG. 1 which indicates the actual measurement value, and the solid lines indicate the respective decomposition relaxation components decomposed by the time constants.

That is, in the relaxation decomposition step according to an embodiment of the present invention, the decomposition relaxation component is decomposed into the first decomposition relaxation component shown in FIG. 2A, the second decomposition relaxation component shown in FIG. 2B, and the third decomposition relaxation component shown in FIG. 2C, and when these components are combined, the relaxation curve shown in FIG. 1 is acquired.

In the relaxation decomposition step according to one embodiment of the present invention, the first decomposition relaxation component shown in FIG. 2A is a component in which a voltage drop occurs due to a micro short circuit.

The second decomposition relaxation component shown in FIG. 2B and the third decomposition relaxation component shown in FIG. 2C are normal relaxation components.

The relaxation decomposition step according to one embodiment of the present invention is an example in which relaxation components according to the three time constants are decomposed into the relaxation components as shown in FIGS. 2A to 2C.

However, in the relaxation decomposition step of the present invention, the number of components that decompose the actually measured relaxation behavior is not limited, and can be arbitrarily set.

Furthermore, the decomposition is not limited to the decomposition by the time constants, and for example, the decomposition can be performed by the relaxation time.

(Micro Short Circuit Determination Step)

In the micro short circuit determination step, the presence or absence of a micro short circuit is determined by determining the presence or absence of a component in which a voltage drop has occurred due to the micro short circuit among a plurality of decomposition relaxation components decomposed in the relaxation decomposition step.

In the method for determining a micro short circuit of the lithium ion secondary battery of the present invention, it is possible to determine the presence or absence of a micro short circuit in the lithium ion secondary battery by determining the presence or absence of a decomposition relaxation component in which a voltage drop has occurred due to the micro short circuit, among the respective decomposition relaxation components acquired in the relaxation decomposition step, thereby determining the presence or absence of the micro short circuit in the lithium ion secondary battery.

In one embodiment of the present invention, it can be seen that the first decomposition relaxation component shown in FIG. 2A (shown by the solid line in the drawings) does not converge within the observation period, i.e., the time constant is long, unlike the second relaxation component shown in FIG. 2B and the third relaxation component shown in FIG. 2C. That is, this provides a determination result in that a micro short circuit exists in the lithium ion secondary battery according to one embodiment.

The method for determining the presence or absence of the micro short circuit is not particularly limited; however, examples thereof include a determination by comparison with a threshold value and a determination by comparison with another lithium ion secondary battery.

In a case of determining by comparison with a threshold value, the time constant and the threshold value of the voltage drop amount set in advance are compared with the time constant and the voltage drop amount of the component in which the voltage drop occurs due to the micro short circuit. Thereafter, when the drop amount in the voltage of the relaxation component having a time constant exceeding the threshold value exceeds the threshold value, it is determined that there is a micro short circuit in the lithium ion secondary battery serving as a measurement target.

The threshold value used for the determination is set according to the magnitude of the short circuit to be detected. Furthermore, for the lithium ion secondary battery having a short circuit of the size that is desired to be detected, it is possible to perform a test for measuring the drop amount of the cell voltage in advance, and set the threshold value on the basis of the actual measurement value.

In a case of determining by comparison with other lithium ion secondary batteries, the drop amount in cell voltage of each of a plurality of lithium ion secondary batteries acquired in the same production unit (lot) is measured, and the results are compared.

If there is a remarkably large drop in cell voltage in the same production unit, it can be determined that the lithium ion secondary battery has a short circuit.

For example, the deviation value of the drop amount in cell voltage of the lithium ion secondary battery is calculated, and if the deviation value is equal to or greater than a specific value, it is determined that there is a micro short circuit.

(Other Steps)

The method for determining a micro short circuit of a lithium ion secondary battery of the present invention may include an optional step other than the relaxation decomposition step and the micro short circuit determination step, which are essential steps described above.

What is claimed is:

1. A method for determining a micro short circuit that determines presence or absence of the micro short circuit in a lithium ion secondary battery, the method comprising:
    a relaxation decomposition step of decomposing a change of a cell voltage in a relaxation process after interrupting charging current during charging or discharging current during discharging into a plurality of decomposition relaxation components respectively with a plurality of time constants; and
    a micro short circuit determination step of determining presence or absence of a micro short circuit by determining presence or absence of a component in which a voltage drop has occurred due to the micro short circuit, among the plurality of decomposition relaxation components.

2. The method for determining the micro short circuit according to claim 1, wherein
    the plurality of decomposition relaxation components includes a first decomposition relaxation component, a second decomposition relaxation component, and a third decomposition relaxation component,
    wherein the first decomposition relaxation component is a component in which a voltage drop occurs due to the micro short circuit, and
    the second decomposition relaxation component and the third decomposition relaxation component are components of normal voltage drop.

* * * * *